US005384855A

United States Patent [19]

Kwang

[11] Patent Number: 5,384,855

[45] Date of Patent: Jan. 24, 1995

[54] AUDIO SYSTEM FOR VEHICULAR APPLICATION

[75] Inventor: David Kwang, Pasadena, Calif.

[73] Assignee: Concept Enterprises, Inc., Vernon, Calif.

[21] Appl. No.: 126,099

[22] Filed: Sep. 23, 1993

Related U.S. Application Data

[63] Continuation of Ser. No. 812,055, Dec. 17, 1991, abandoned, which is a continuation-in-part of Ser. No. 460,635, Jan. 3, 1990, Pat. No. 5,111,508, which is a continuation-in-part of Ser. No. 314,509, Feb. 21, 1989, Pat. No. 4,905,284.

[51] Int. Cl.[6] .......... H03G 5/00

[52] U.S. Cl. .......... 381/100; 381/86

[58] Field of Search .......... 381/24, 86, 99, 100

[56] References Cited

U.S. PATENT DOCUMENTS 3,016,424 1/1962 Franke .
3,417,203 12/1968 Hafler .
3,959,590 5/1976 Scheiber .......... 381/22
4,408,095 10/1983 Ariga et al. .
4,583,245 4/1986 Gelow et al. .
4,633,501 12/1986 Werrbach .
5,111,508 5/1992 Gale et al. .......... 381/100

OTHER PUBLICATIONS

"Hear The Power," *Pyramid Phase III tenna*, Jan. 1989, 2 pp. brochure.

*Primary Examiner*—Forester W. Isen
*Attorney, Agent, or Firm*—Merchant, Gould, Smith, Edell, Welter & Schmidt

[57] ABSTRACT

Electronic crossover audio systems and methods in accordance with the invention provide flat frequency response and the feeling of three-dimensional music reproduction with a well defined image of the placement of various instruments, the vocal source across the sound stage, and a distinct impression of good depth of feel. A four submodule crossover module capable of serially chaining and having a fourth submodule for front and rear center monaural outputs provides infinite segmentation and modification of incoming audio frequency signals as well as provides for center monaural submodules to supply lifelike musical performances with superior clarity in a three-dimensional imaging.

9 Claims, 5 Drawing Sheets

AUDIO SYSTEM FOR VEHICULAR APPLICATION

CROSS-REFERENCE TO RELATED APPLICATION

This is a continuation of application Ser. No. 07/812,055, filed Dec. 17, 1991, which was abandoned upon the filing hereof, which is a continuation-in-part application of application Ser. No. 07/460,635, filed on Jan. 3, 1990, now U.S. Pat. No. 5,111,508, issued on May 5, 1992, which is a continuation-in-part application of Ser. No. 07/314,509, filed Feb. 21, 1989, now U.S. Pat. No. 4,905,284 issued on Feb. 27, 1990, both documents herein incorporated by reference into the present application.

BACKGROUND OF THE INVENTION

1. Field of the Invention

The present invention generally relates to systems and methods for high fidelity sound reproduction, and more particularly, to systems and methods for separating and directing signals in different frequency bands in a multi-driver, multi-speaker, vehicular audio system.

2. Description of Related Technology

Car stereo systems face unique problems in high fidelity reproduction of recorded or broadcast sound, because speaker placement, speaker types, amplifier power, crossover networks, limited internal space, internal vehicle geometry, and other factors can all affect the quality and characteristics which the listener hears. Increasing amplifier power, despite the consequent expense, does not confront the major problems, which derive both from the limited space available for installations and the complex nature of internal reflections within a vehicle. Acoustic waves launched from a given speaker location into the interior of a vehicle are reflected with relatively short distances off interior surfaces. They then will often reflect back and forth between opposed surfaces to establish standing waves, thus creating resonance peaks within the audible frequency spectrum. Because the interior dimensions of a vehicle are limited, resonances arise in the longer wave (low frequency) region of approximately 60 Hz or less to 300 Hz or more. Moreover, such simple resonances are often accompanied by complex standing waves which are created because of multiple, oblique-angled reflections off different surfaces within the three-dimensional volume of the vehicle.

There has been an increasing recent trend toward improving the fidelity of car audio systems, as opposed to earlier tendencies to use excessive power at low frequency levels. An earlier stereo installation might have used two speakers, each comprising a mid-range and tweeter unit, spaced apart in the front or rear of the vehicle. These would be driven through a crossover network from a single amplifier. It is now common to use "multi-amp" installations, in which speakers for the different frequency ranges are each driven by a separate amplifier. The value of cleaner low frequency ranges has become more apparent and separately driven woofers and sub-woofers are thus increasingly being used. The multi-amp installations include so-called "bi-amps", employing a two-way division of the frequency ranges, and "tri-amps" in which the division is between low frequency (woofer), mid-range unit and high frequency (tweeter). A sub-woofer is alternatively used for the lowest frequency range to enhance bass response, the sub-woofer unit often being monaural.

There are two basic methods of mounting sub-woofers in a vehicle, namely "free air" or in an enclosure (sealed or vented). Mounting sub-woofers in an enclosure that is properly matched to the characteristics of the woofers results in tighter base, better transient frequency response, and higher power handling ability. Unfortunately, all woofers have different characteristics and therefore require custom designed enclosures for maximum performance. To build a proper matching enclosure (commonly known as a tuned enclosure) requires knowledge of complex mathematical equations developed through the science of acoustics.

In brief, mounting any woofer in a sealed enclosure causes the woofers frequency response to roll off below the resonant frequency of the enclosure at a rate of 12 dB per octave. The smaller the enclosure, the higher the resonant frequency becomes. Based on mathematical calculations, a typical woofer requires a sealed enclosure of about 2.2 cubic feet or 1.6 cubic feet if the enclosure is vented. There is rarely available space in an automobile for such a large enclosure. Most vehicles can only accommodate an enclosure of approximately 1.2 cubic feet or less.

The limited space availability in an automobile often lends itself to the placement of a sub-woofer system in the rear and the midrange/tweeter systems in the front and/or along the sides. Due to this placement problem, the acoustical time delay may occur between the time the sub-woofer system is heard as oppose to when the midrange/tweeter system is heard. Furthermore, the limited space in an automobile may allow room for a single sub-woofer installation only. The internal geometry of the vehicle varies with car style, even in a particular model (e.g. two door vs. four door) and with the interior materials that are used. Thus if electronic crossovers are to be used to flatten frequency response, or shape frequency response to the likes of the listener, a design having novel versatility is required.

To achieve a substantially flat frequency response within a vehicle using a multi-amp system, the trend has been to use electronic crossovers. The electronic crossovers are adjustable as to crossover point, and operate more efficiently than do passive crossover networks. Because they are adjustable, a troublesome resonance or null in a given frequency range can be compensated by spacing crossover points so as to diminish response, or overlapping the crossover points so as to enhance response.

Known electronic crossover systems are limited in their capabilities, as presently implemented, because they are generally restricted to two separate independently adjustable frequency bands. It is recognized that they can be cascaded (used in series) to give tri-amp as well as bi-amp capability, but this limits the capability for adjustment because a later crossover can only choose a higher high-pass (or a lower low-pass) level for cutoff.

Additionally, a good audio system should give the listener the feeling of three-dimensional music reproduction with a well defined image of the placement of various instruments, the vocal source across the sound stage, and a distinct impression of good depth of feel. If a system is designed and installed properly, the point location of speaker elements should not be easily identifiable. Instead, it will give one a feeling that he is surrounded by a live orchestra in the concert hall.

SUMMARY OF THE INVENTION

Systems and methods in accordance with the invention disclose three (high, band and low pass) crossover networks and a fourth submodule for front and rear center monaural outputs. Infinite segmentation and modification of the audio frequency spectrum may be made by chaining a plurality of these modules together with each module having a unique set of three crossover points along with front and rear center outputs for enhancing the overall ambience effect. Center submodules are incorporated into a vehicular audio system to provide the illusion of lifelike musical performances with superior clarity in a three-dimensional imaging.

Each module includes a high pass, a band pass (which can also be used as a high pass by appropriate frequency settings) and a low pass crossover selection all of which are continuously adjustable and completely independent of each other, providing an "asymmetrical" electronic crossover network. The asymmetrical crossover network may be adjusted to achieve an acoustically flat system response by providing crossover points at slightly above as well as slightly below the resonant frequencies.

Front and rear stereo input signals may be applied separately to a first and second submodules or a single pair of stereo signals may be applied to the first and second submodules in parallel. The left and right stereo signals of both front and rear submodules are summed together by a summing circuit to form composite left and right stereo signals. The composite signals are applied to generate monaural front and rear center submodules and are selectably applied to the input of a third submodule and to a mixed input/output port for coupling to another crossover module. The input/output port is alternatively selectable as an input for the third submodule so that signals independent of the first and second submodules can be applied.

The module includes a front-center submodule output for providing a monaural signal to a front-center amplifier to drive a midrange/tweeter system usually mounted in the center of the dash midway between the driver and the passenger. Mounting arrangements may also take advantage of the reflecting angle of the windshield to provide the best sound effect from the center submodule. The front center submodule includes a selectable high pass crossover to eliminate unwanted low frequencies from reaching the front center output. A rear center submodule is also included for providing an adjustable monaural output signal to a rear-center amplifier for providing a trace of rear fill without overemphasizing its presence to enhance the overall ambience effect.

The first submodule includes high pass filter means having a wide selectable lower cutoff range. The second submodule includes bandpass filter means having both a selectable lower and upper cutoff frequency which liberally overlap. All submodules include preamplifiers and level adjustment controls. The first and second submodules also include means for shifting the cutoff points by a multiplying factor to a substantially higher level.

The third submodule includes low pass filter means, a switchable stereo/monaural output feature for single sub-woofer application, a switchable 12 dB per octave equalization means at 45 Hz to equalize the woofer/enclosure frequency response roll off, a phase inverter to compensate for substantial delay in the sub-woofer output relative to the higher frequency waves from differently placed tweeter and mid-range speakers.

With these arrangements and features therefore, systems in accordance with the invention can provide a flat frequency response and the feeling of three-dimensional music reproduction with a well defined image of the placement of various instruments, the vocal source across the sound stage, and a distinct impression of good depth of feel, giving one a feeling that he or she is surrounded by a live orchestra in the concert hall.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1A:
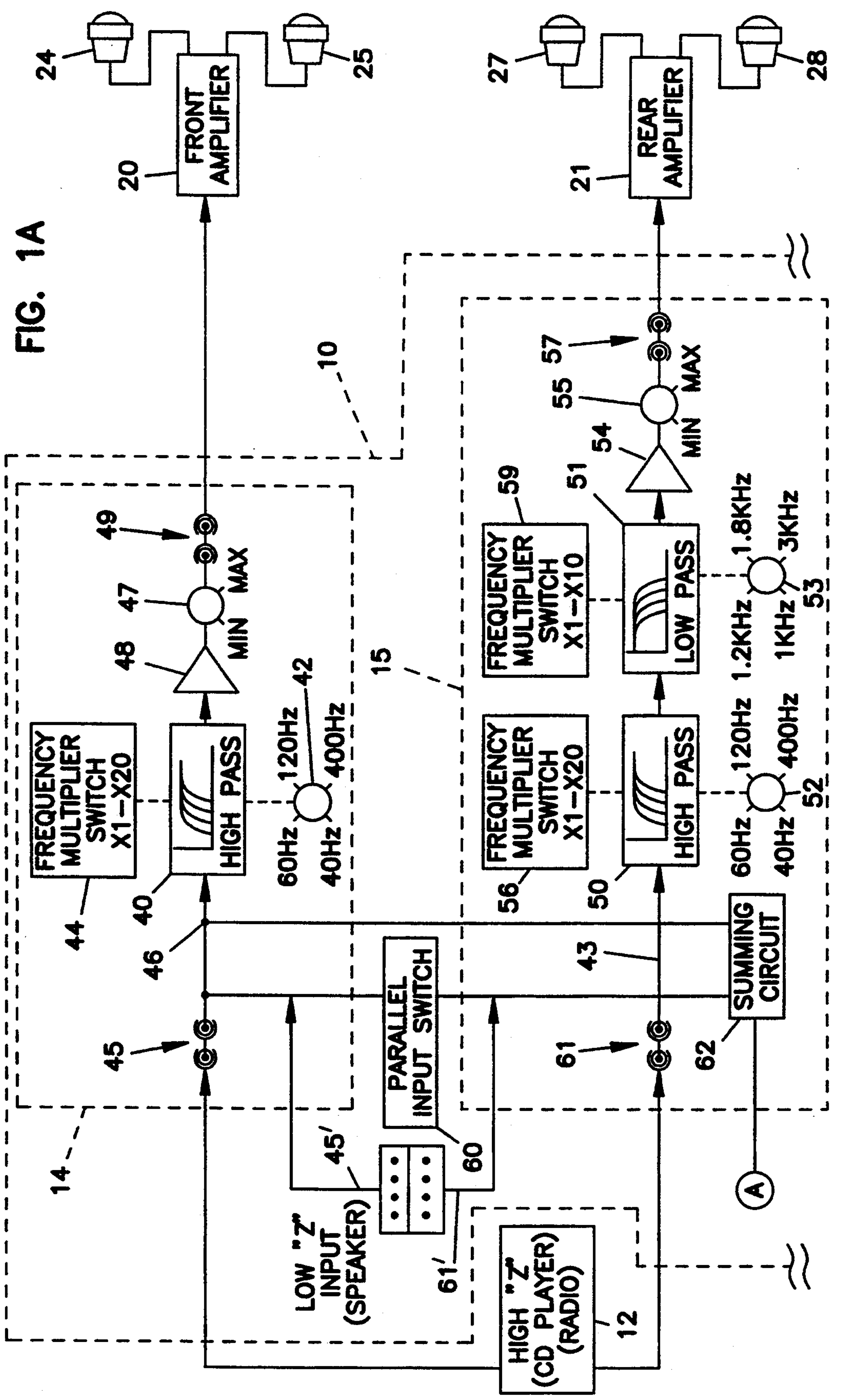
FIGS. 1A and 1B combined are a block diagram of an electronic modular audio system in accordance with the invention for vehicle installation.

Reference is now made to FIG. 1 which depicts an electronic module 10 in accordance with the present invention. Line level (high impedance) front and rear stereo input ports 45 and 61 are coupled to the output of a signal source 12 such as a compact disc player or radio receiver. Alternatively, unitary (low impedance) speaker input port separated into front and rear sections 45' and 61' may be driven directly from speaker outputs from units not having preamplifier compatibility. Separate first, second, third, and fourth submodules 14, 15, 16 and 17 within module 10 feed signals to a front amplifier 20, rear amplifier 21, sub-woofer amplifier 22, front-center amplifier 23 and rear-center amplifier 19 respectively, each amplifier providing outputs to a different pair of associated speakers. The front amplifier 20 drives left and right midrange/tweeter speakers 24, 25 while the rear amplifier 21 drives a like pair of midrange/tweeter speakers 27 and 28. The front-center amplifier 23 drives a front midrange/tweeter speaker 26 with a composite (i.e., left submodule plus right submodule signal). Rear-center amplifier 19 drives a rear midrange/tweeter speaker 29 with a composite left submodule minus right submodule signal. Fourth submodule monaural front-center and rear-center paths provide sound staging and ambience enhancement.

The sub-woofer amplifier 22 drives a pair of large speakers 30, 31 with composite (front and rear) signals.

Within the electronic module 10, the first submodule 14 includes a high pass crossover circuit 40 controllable by a selector control 42 having markings at 40, 60, 120 and 400 Hz and continuous settings therebetween and a multiply by 20 frequency multiplier switch 44. When frequency multiplier switch 44 is engaged to a X20 position, the high pass circuit 40 provides a lower cutoff frequency ranging from 800 to 8,000 Hz. In other words, the high pass circuit 40 cuts off the frequencies below the level selected by the combination of selector control 42 and multiplier switch 44. The input signal to the high pass circuit 40 is applied at input line 46 from either input ports 45 (45') or from 61 (61') when parallel switch 60 is activated. The output signal from high pass circuit 40 is applied through a pre-amp 48 and a level adjust circuit 47 to the front output port 49, which is coupled to provide inputs to the front amplifier 20.

The second submodule 15 includes a bandpass crossover circuit comprising a high pass circuit 50 in cascade with a low pass circuit 51. The high pass circuit 50 which provides a variable lower cutoff frequency through selector control 52 and frequency multiplier switch 56. The low pass circuit 51 provides a variable upper cutoff frequency through selector control 53 and frequency multiplier switch 59. Selector control 52 having markings at 40, 60, 120 and 400 Hz provides a continuously variable lower cutoff frequency ranging from 40 to 400 Hz when frequency multiplier switch 56 is set to X1 and ranging from 800 to 8000 Hz when switch 56 is set to X20. Selector control 53 having markings at 1, 1.2, 1.8 and 3 KHz provides a continuously variable cutoff upper frequency ranging from 1 KHz to 3 KHz when switch 59 is set to X1 and from 10 KHz to 30 KHz when switch 59 is set to X10. Together, circuits 50 and 51 provide a bandpass circuit with independently adjustable lower and upper cutoff frequencies. The input signal is applied to the high pass circuit 50 at input line 43 from input ports 61 (61') or 45 (45') if parallel switch 60 is selected. The output signal from low pass circuit 51 is applied through a pre-amp 54 and a level adjust circuit 55 to the rear output port 57, which is coupled to provide inputs to a rear amplifier 21.

The parallel input switch 60 between the input lines in the first submodule 14 and the second submodule 15 provides for internal parallelism between these inputs, when the switch 60 is closed to complete the parallel path. In the parallel setting one input controls both submodules, while in the alternate setting, separate inputs must be applied.

The stereo inputs of both the first and second submodules 14, 15 are coupled to a summing circuit 62 for providing composite (front and rear) signals. Stereo inputs to the front input port 46 (46') for the first submodule 14 and to the rear input port 61 (61') for the second submodule 15 are used to activate the fourth submodule 17 and may be switched to activate the third submodule 16.

Figure 1B:
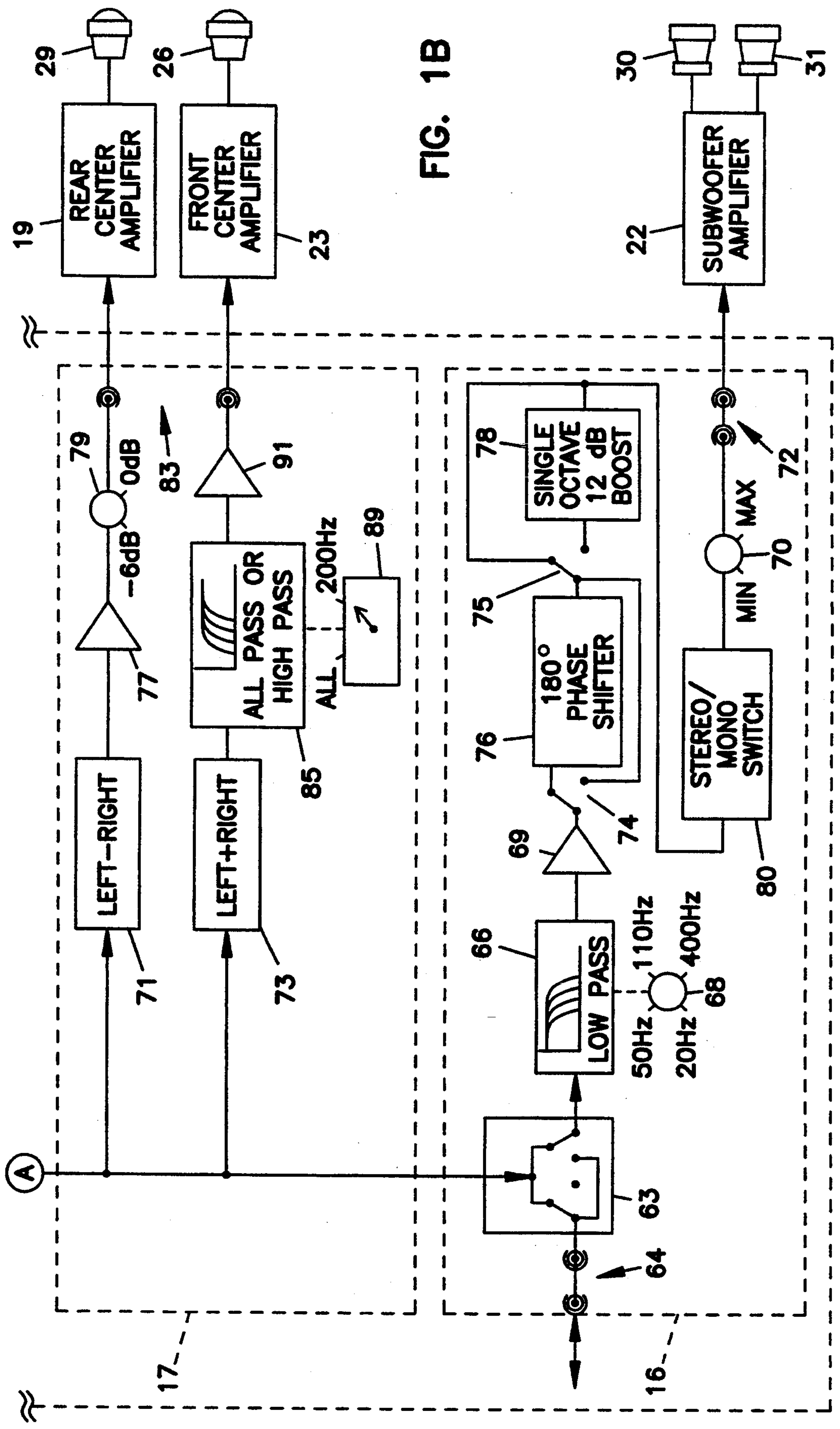

As best seen in FIG. 1B, the output from summing circuit 62 is coupled to the fourth submodule 17 through an input of a subtracting circuit 71 and a summing circuit 73. Subtracting circuit 71 subtracts the composite (front-rear) right signal from the composite left signal to form a monaural rear-center signal. The output of the subtracting circuit 71 is applied through a pre-amp 77 and a level adjust circuit 79 to the center output port 83, which is coupled to provide a center-rear input to center amplifier 19. Summing circuit 73 sums the composite (front-rear) right signal with the composite left signal. The output from summing circuit 73 is applied to a crossover circuit 85 which is selectable by selector switch 89 to pass all frequencies or to pass frequencies only above 200 Hz. The output of crossover circuit 85 is coupled through pre-amp 91 to the center output port 83, which is coupled to provide an input to front-center amplifier 23.

The output from summing circuit 62 is also coupled through selector control 63 to a mixed in/out port 64. Selector control 63 has a first position which passes composite front and rear signals to the third submodule 16 and out through port 64. When in the first position, control 63 routes a stereo mix of the front and rear audio signals to the mixed in/out port 64 and to the subwoofer submodule 16. Additional crossover points may be had by connecting the mixed in/out port 64 to the input of a second module 10' and so on. Selector control 63 has a second position for exclusively coupling port 64 as an input port to third submodule 16. The second position allows input signals to be coupled through port 64 to the third submodule 16 while disconnecting both first and second outputs. With control 63 is in the second position, a sub-woofer input independent of the signals present on the front and rear submodules 14 and 15 is provided through the mixed in/out port 64 to the third module 16.

In the third submodule 16, the electronic crossover 66 is a low pass filter circuit, again controllable by a selector control 68 having markings of 20, 50, 110 and 400 Hz with settings also being available therebetween. The low frequency signals passing the low pass crossover 66 are boosted in a pre-amp 69, following which signals can be passed directly to a level adjust circuit 70 before being directed to the subwoofer output port 72. However, selectively actuable switches 74, 75, comprising single pole double throw elements or the like, can be utilized to transfer the signal through a 180° phase shifter 76. A sub-woofer speaker spaced at some distance from higher frequency speakers may result in acoustic wave energy that starts in phase reaching the listener's ear at different times. Introducing a 180° phase shift may compensate for this time differential. The second switch 75 is used to couple in a 12 dB per octave equalization circuit 78 which operates at 45 Hz. Also in series with the third submodule is a stereo/mono switch 80 which can be placed in the mono position if only a single sub-woofer is to be driven or if mono output is preferable from the listener's standpoint.

Crossover circuits 40, 50, 51 66 and 85 may be asymmetrically set to provide multiple crossover points slightly above and below resonant frequencies.

Figure 2:
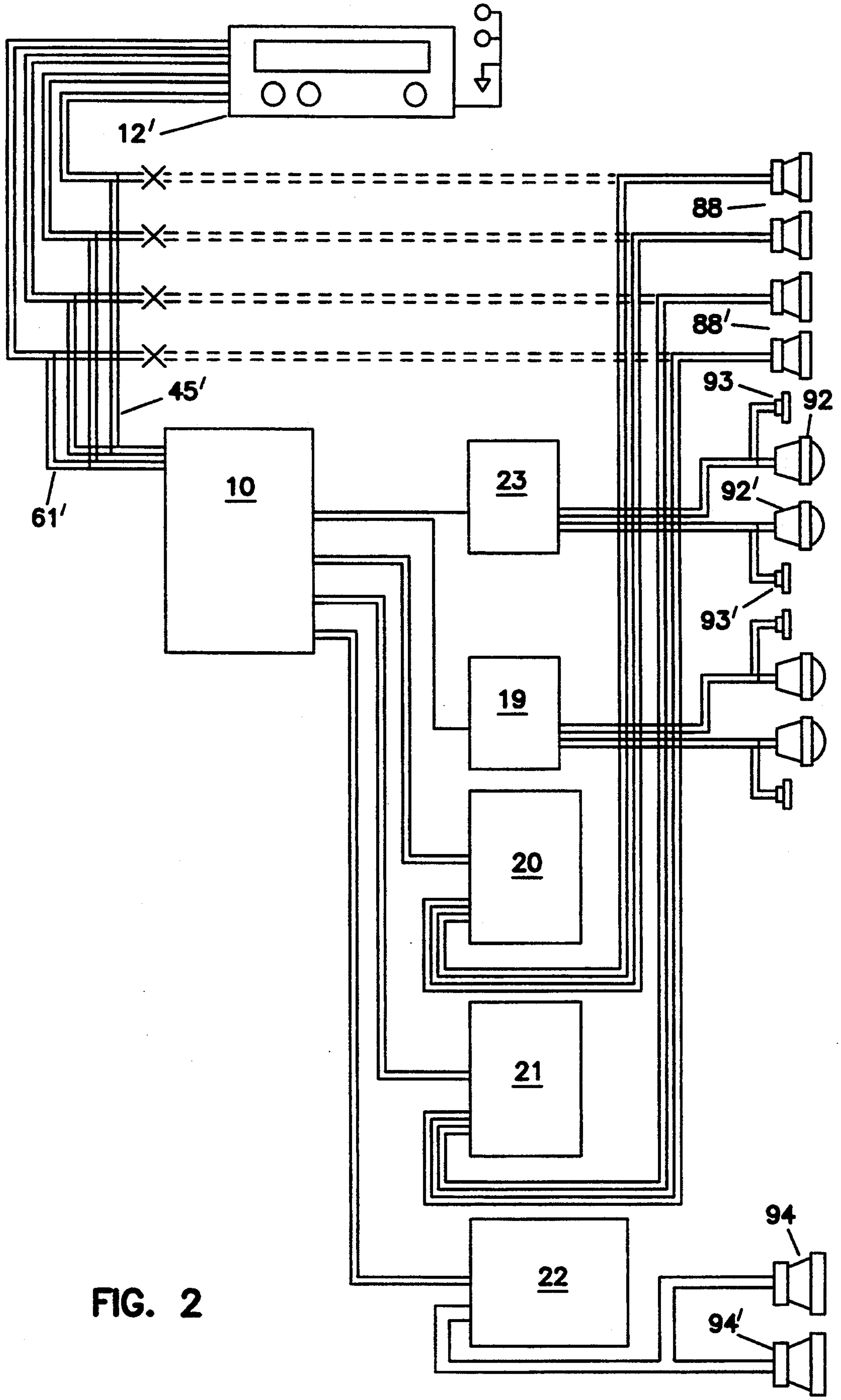
FIG. 2 is a block diagram representation of an audio installation utilizing electronic modules in accordance with the invention in a bi-amp configuration.

FIG. 2 depicts the present invention in a bi-amp configuration with an audio signal source 12' such as an original equipment manufacturer (OEM) radio/cassette, providing front and rear speaker level signals to a crossover module 10 through low impedance inputs 45' and 61' with the parallel input switch 60 deactivated. Typical crossover settings (not shown) for a bi-amp configuration include selector control 42 set at a high pass cutoff of 100 Hz with frequency multiplier switch 44 set to X1. The band pass is set to a start frequency of 100 Hz by selector control 52 in conjunction with frequency multiplier switch 56 set to X1 and to a stop frequency of 25 KHz with selector control 53 set to 2.5 KHz in conjunction with frequency multiplier switch 59 set to X10. Selector control 63 is set to route the output of summing circuit 62 to the third submodule 16 (subwoofer) while the low pass filter 66 is set by selector control 68 to 100 Hz and switch 80 set to monaural. Front-center amplifier 23 is coupled to a pair of tweeters 93 and 93' and to a pair of midrange speakers 92 and 92'. Rear center amplifier 19 is coupled to a like set of midrange and tweeter speakers. Front power amplifier 20 and rear power amplifier 21 are depicted each driving a pair of factory installed (midrange) speakers 88 and 88'. Subwoofer amplifier 22 is depicted driving large subwoofer speakers in 94, 94' connected in serial fashion for monaural operation.

Figure 3:
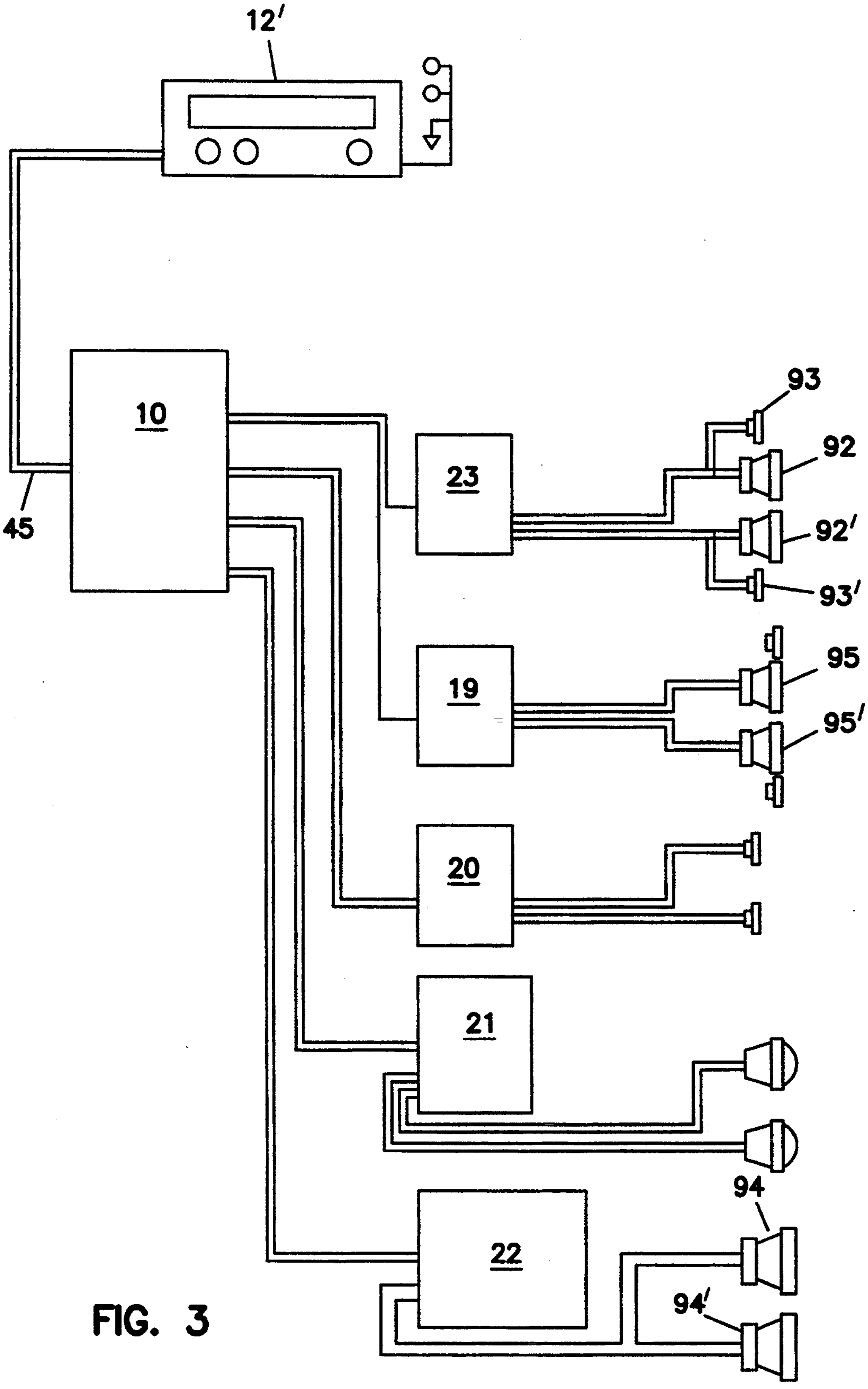
FIG. 3 is a block diagram representation of another audio installation using electronic modules in accordance with the invention in a tri-amp configuration.

A tri-amp system is depicted in FIG. 3 with the audio signal source 12′ having stereo front preamplifier outputs coupled to front preamplifier compatible inputs 45 with the parallel input switch 60 activated. As in the bi-amp mode, front center power amplifier 23 drives a pair of midrange speakers 92 and 92′ and a pair of tweeters 93 and 93′. The rear center power amplifier 19 drives a pair of two-way speakers 95 and 95′. The front amplifier 20 drives a pair of tweeters while the rear amplifier 21 drives a pair of mid-woofer speakers and the sub-woofer amplifier 22 drives a pair of sub-woofer speakers. Typical crossover settings (not shown) for a tri-amp configuration include at a high pass cutoff of 3000 Hz with selector control 42 set at 150 Hz and frequency multiplier switch 44 set to X20. The band pass is set to a start frequency of 80 Hz by selector control 52 in conjunction with frequency multiplier switch 56 set to X1 and to a stop frequency of 3 KHz with selector control 53 in conjunction with frequency multiplier switch 59 set to X1. Selector control 63 is set to route the output of summing circuit 62 to the third submodule 16 (subwoofer) while the low pass filter 66 is set by selector control 68 to 80 Hz and switch 80 set to monaural.

Figure 4:
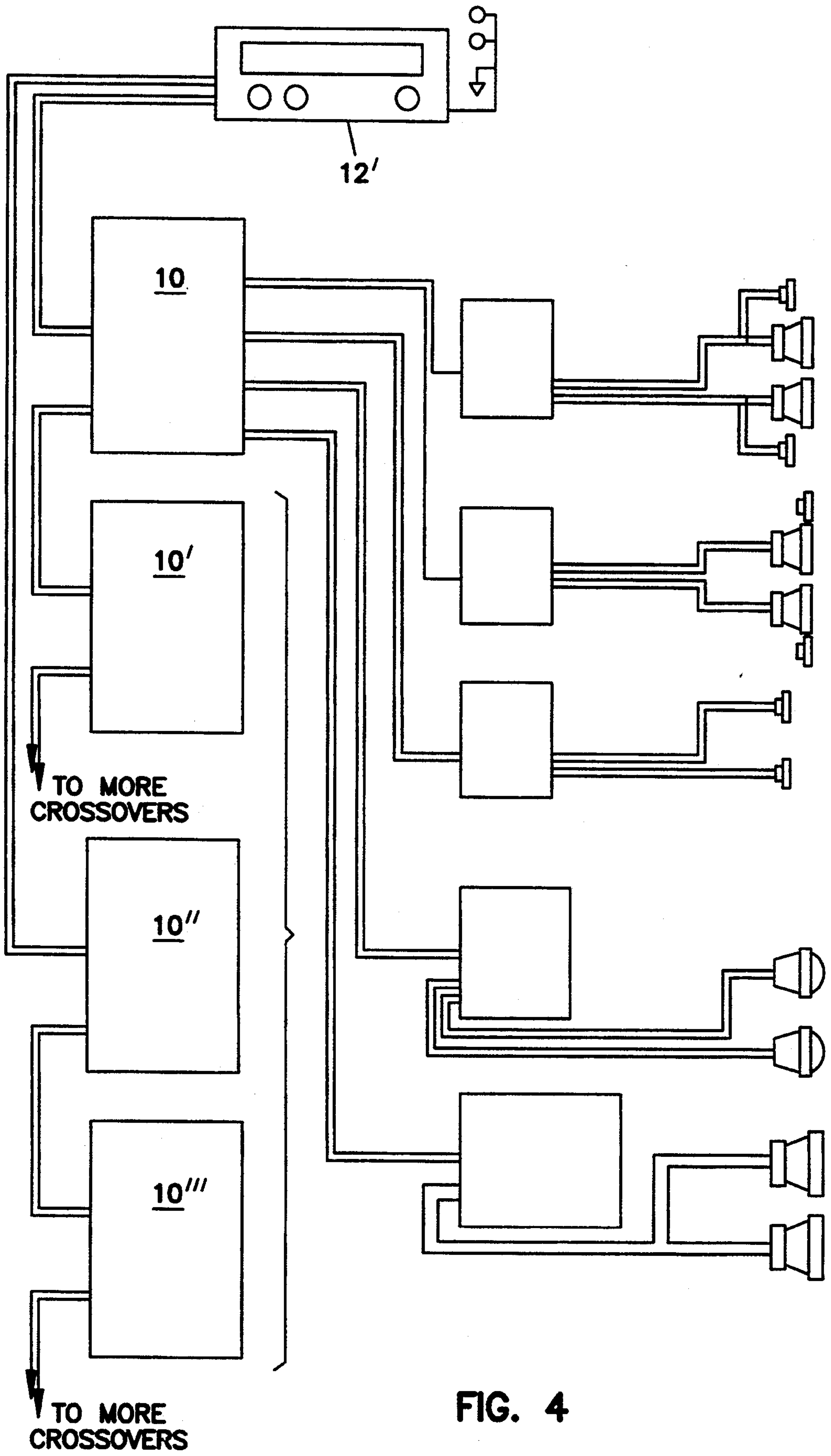
FIG. 4 is a block diagram representation of another audio installation using electronic modules in accordance with the invention in a multi-amp configuration.

FIG. 4 depicts a multi-amp system utilizing multiple crossover modules for providing a plurality of crossover points in excess of standard low, mid and high pass values. The modules can be chained together on ad infinitum. Signal source 12′ provides front preamplifier compatible inputs to module 10 and rear preamplifier compatible inputs to module 10″. Module 10 has its input/output port 64 configured as an output port and has it coupled to the front preamplifier compatible input 45 of a second crossover module 10′. The mixed input/output port crossover module 10″ is coupled to the preamplifier compatible input 45 of a fourth crossover module 10‴. Skilled artisans will readily appreciate that additional crossover networks may be chained together with front submodule crossover modules 10, 10′ and rear submodule crossover modules 10″, 10‴ respectively, for providing even more additional crossover points. Parallel input switch 60 and control 63 on crossover modules 10 through 10‴ are set so that the input port 45 (45′) is coupled to both front and rear submodules 14 and 15 and that mixed input/output port 46 is set to an output port and for routing the stereo mix of both front and rear submodules 14 and 15 to subwoofer submodule 16. Only front-center and rear-center submodules on module 10 are utilized for providing a trace of front and rear fill without over emphasizing its presence.

Thus intercoupling arrangements, speaker combinations, and crossover points can be varied to achieve a wide range of different effects, in accordance with the invention. It will be appreciated that the depicted forms and variations are merely illustrative, and that the scope of the invention is to be defined by the appended claims.

What is claimed is:

1. An electronic modular audio system for use in multiple amplifier configurations, coupled to an audio signal source comprising:

(a) first, second, third and fourth signal submodules, the first, second, and third submodules having externally accessible inputs and an outputs, the fourth submodule having an input internally coupled to the input of the first and second signal submodules and an externally accessible output, the first submodule including adjustable high pass crossover means, the second submodule including adjustable band pass crossover means, the third submodule including adjustable low pass crossover means, and the fourth submodule including a first parallel path having selectable high pass crossover means and a second parallel path having an adjustable output level control, each crossover means in all submodules being independently adjustable of each other and wherein the first and second submodules include crossover frequency multiplier switch means for multiplying the respective crossover means to a substantially higher frequency;

(b) parallel switch means for selectively coupling inputs of the first and second submodules in parallel;

(c) front and rear summing means having input means coupled to the first and second submodule inputs and having an output coupled to an input of the third and fourth submodules; and (d) mixed input/output switch means having a first position for coupling the front and rear summing means as an input port to the third submodule input and a second position for coupling the front and rear summing means as an output port to a mixed input port/output port means for providing module chaining capabilities to other modules.

2. A system as set forth in claim 1 above, wherein the third submodule further comprises selectively actuable means for shifting the phase of the signal there by 180°.

3. A system as set forth in claim 2 above, further comprising means for providing 12 dB per octave boost in the third submodule at 45 Hz.

4. A system as set forth in claim 3 above, wherein the input signal to the first and second submodules includes stereo left and right signal components and the fourth submodule further comprises:

(a) left and right summing means in the first path having an input for summing the right signal with the left signal and an output coupled in cascade with the selectable high pass crossover means for providing a front-center output thereon; and (b) left and right subtracting means in the second path having an input for subtracting the right signal from the left signal and an output coupled in cascade with the adjustable level output for providing a rear-center output thereon.

5. A system as set forth in claim 4 above, further comprising a low impedance input port adapted for receiving speaker output signals and a line level impedance input port adapted for receiving preamplifier compatible output signals, both ports coupled to the first and second submodule inputs.

6. A system as set forth in claim 5 above, wherein the band pass crossover means in the second submodule provides a large adjustable upper cutoff frequency range so that the means may be used as a high pass crossover.

7. A system as set forth in claim 6 above, wherein the high pass crossover means in the first submodule has a selectable low cutoff frequency in the range of 40 to 8000 Hz and wherein the band pass crossover means of the second submodule has a selectable low cutoff frequency range of 40 to 8000 Hz and a selectable high cutoff frequency range of 1 Khz to 30 Khz.

8. A system as set forth in claim 1 above, further including separate means in each of the different submodules for adjusting the level of the signal therein, and wherein the crossover means frequencies are adjustable.

9. A plurality of electronic crossover modules, each crossover module in accordance with claim 1 above, wherein a first module has its mixed input/output means coupled to the first submodule input of a second system and the second module has its mixed input/output means coupled to the first submodule input of a third system and so forth.

* * * * *